United States Patent
Severson et al.

(10) Patent No.: US 6,775,530 B2
(45) Date of Patent: Aug. 10, 2004

(54) DIRECT CONVERSION OF NARROW-BAND RF SIGNALS

(75) Inventors: Matthew L. Severson, Oceanside, CA (US); Inyup Kang, San Diego, CA (US); Arun Raghupathy, San Diego, CA (US)

(73) Assignee: Qualcomm Inc., San Diego, CA (US)

(*) Notice: Subject to any disclaimer, the term of this patent is extended or adjusted under 35 U.S.C. 154(b) by 411 days.

(21) Appl. No.: 10/067,611

(22) Filed: Feb. 4, 2002

(65) Prior Publication Data

US 2003/0100286 A1 May 29, 2003

Related U.S. Application Data

(60) Provisional application No. 60/333,723, filed on Nov. 27, 2001.

(51) Int. Cl.[7] .................................................. H04B 1/26
(52) U.S. Cl. ......................... 455/324; 455/323; 455/207
(58) Field of Search ................................. 455/324, 325, 455/326, 334, 102, 139, 205, 206, 207, 313, 323, 339; 370/347; 375/297

(56) References Cited

U.S. PATENT DOCUMENTS

| 5,517,689 A | 5/1996 | Hayashihara | 455/205 |
| 5,734,683 A | 3/1998 | Hulkko et al. | 375/316 |
| 5,787,125 A | 7/1998 | Mittel | 375/329 |
| 6,144,708 A | 11/2000 | Maruyama | 375/327 |

FOREIGN PATENT DOCUMENTS

| EP | 1067674 | 1/2001 | H03D/7/16 |
| GB | 2348345 | 1/2000 | H04L/27/227 |
| WO | 9708842 | 3/1997 | H04B/1/26 |

*Primary Examiner*—Tony T. Nguyen
(74) *Attorney, Agent, or Firm*—Philip R Wadsworth; Charles D. Brown; George C Pappas (57) ABSTRACT

A method and device for converting at least one narrow band RF signal, being suitable for transmission between at least one communications device suitable for receiving wide-band RF signals and at least one base station, to baseband. The method includes directly down-converting a signal spectrum including the at least one RF narrow-band signal to baseband such that the at least one narrow-band RF signal results at a low intermediate frequency (IF). And, digitally phase rotating the down-converted signal spectrum such that the at least one narrow-band RF signal is phase rotated from the low-IF to baseband.

24 Claims, 6 Drawing Sheets

DIRECT CONVERSION OF NARROW-BAND RF SIGNALS

RELATED APPLICATIONS

This application claims priority to pending Provisional application No. 60/333,723, filed on Nov. 27, 2001, incorporated herein by reference.

BACKGROUND

1. Field

The present invention relates generally to wireless communications systems, and more particularly to downconverting narrow band radio frequency (RF) signals.

2. Description of Related Art

In a frequency division multiple access (FDMA) analog cellular system, such as an Advanced Mobile Phone System ("AMPS") analog cellular radio system, the available frequency spectrum is divided into radio channels, e.g., pairs of transmit and receive carrier frequencies, each of which corresponds to a message transmission channel. The bandwidth of each transmit and receive frequency channel is narrowband, generally 25–30 kHz. The cellular service area in the FDMA system is generally divided into a plurality of cells, each cell having a set of frequency channels selected so as to minimize co-channel interference between cells.

Further, expanding mobile telephone market and the advantages of digital processing have been driving many advancements in digital cellular applications. One commonly used communication standard among mobile phones is Code Division Multiple Access (CDMA).

Direct downconversion schemes have been proposed which accomplish the RF-to-baseband downconversion using a single stage. In this instance the LO frequency and RF carrier can be matched in frequency and the resultant signal is produced at baseband. This technique uses a homodyne receiver to the down convert in a single stage. However, this single downconversion technique, referred to as Zero Intermediate Frequency (ZIF) downconversion, produces unwanted inter-modulation products. For example, it produces a zero frequency DC component which adversely affects the data content of the baseband signal. This DC component may be removed using digital techniques if the analog ZIF baseband signal is first converted to the digital domain by Analog to Digital (A/D) conversion. The DC component can then be mathematically removed via bit manipulations, for example. Thus, the technique of ZIF downconversion is attractive due to its simplicity.

A need exists for making receivers incorporating such a direct-downconversion scheme for wide-band RF signals, such as those found in CDMA systems, compatible with narrow-band signals, such as those signals employed in connection with the AMPS analog cellular radio system, for example.

SUMMARY

A method and device for converting at least one narrow band RF signal, being suitable for transmission between at least one communications device suitable for receiving wide-band RF signals and at least one base station, to baseband is disclosed. The invention includes directly down-converting a signal spectrum including the at least one RF narrow-band signal to baseband such that the at least one narrow-band RF signal results at a low intermediate frequency (IF); and, digitally phase rotating the down-converted signal spectrum such that the at least one narrow-band RF signal is phase rotated from the low-IF to baseband.

BRIEF DESCRIPTION OF THE DRAWINGS

The invention will be better understood with reference to the following illustrative and non-limiting drawings, wherein like references identify like elements of the invention, and.

DETAILED DESCRIPTION

It is to be understood that the figures and descriptions of the present invention have been simplified to illustrate elements that are relevant for a clear understanding of the present invention, while eliminating, for purposes of clarity, many other elements found in a typical mobile communication device. Those of ordinary skill in the art will recognize that other elements are desirable and/or required in order to implement the present invention. However, because such elements are well known in the art, and because they do not facilitate a better understanding of the present invention, a discussion of such elements is not provided herein.

Figure 1:
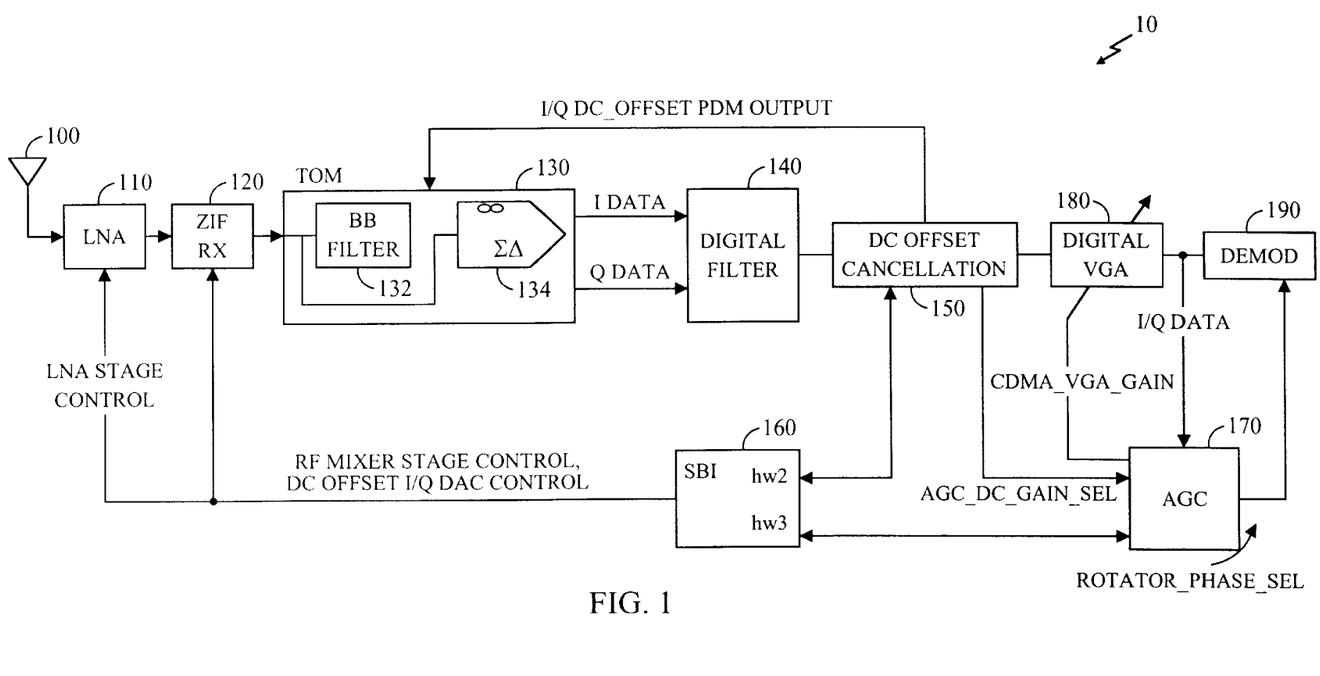
FIG. 1 illustrates a block diagram of an exemplary mobile phone receiver front end.

Referring now to FIG. 1, there is shown a block diagram of an exemplary mobile phone receiver front end 10 for a mobile communication device, such as a mobile or cellular telephone, discussed in detail in the previously identified and incorporated copending patent application. The reader is referred to this commonly assigned and copending patent application for a thorough discussion there-regarding. Nonetheless, and for sake of clarity only, the front end receiver 10 illustrated in block diagram form in FIG. 1 will be briefly discussed herein. The receiver front end includes an RF antenna 100, an RF amplifier 110, a Zero Intermediate Frequency (ZIF) downconverter 120, a modulator 130, such as an over-sampled modulator which may include a baseband filter 132 and a sigma delta modulator 134, digital filter 140, a DC offset cancellation block 150, a Serial Bus Interface (SBI) 160, an Automatic Gain Control (AGC) loop 170, a Digital Variable Gain Amplifier (DVGA) 180, and a demodulator 190.

An encoded wideband RF signal from, for example, a base station or second mobile communication device, is received at RF antenna 100. A multiple stage RF front-end amplifier, typically a low noise amplifier (LNA) 110, can be used to amplify the wideband signal to a level sufficient for subsequent signal processing. The amplified wideband signal is then down converted directly to baseband using a direct downconversion scheme, such as the aforementioned ZIF scheme. More specifically, the direct downconversion scheme may be implemented, for example, using a zero intermediate frequency (ZIF) stage, although other direct downconversion schemes will be apparent to those skilled in the art and may be readily used in the present invention.

The exemplary ZIF stage may employ a local oscillator (LO) having an analog mixer, in order to directly downconvert the wideband RF signal to low frequency baseband. In the ZIF downconversion scheme, the LO frequency used for mixing with a wideband signal of interest is preferably substantially the same as the carrier frequency. As is well known in the art, the mixing of analog signals results in a difference product that contains the wideband signal of interest. The mixing in the present invention may also produce a low frequency component that may be zero frequency, i.e. DC, which low frequency component may be present within the wideband signal band of interest. According to the LO frequency selected, this low frequency component (DC component) may, for example, vary from about 0 Hertz to about 30 kHz, and other ranges will be apparent to those skilled in the art. A significant DC component may also result from reflections in the mixing process devices. This DC component is at low frequency and may add into the baseband wideband signal of interest, thereby distorting and corrupting the wideband signal of interest.

The downconverter output is provided to a modulator 130, such as a third-generation over-sampled modulator (TOM). The modulator 130 accepts an analog signal, and preferably acts to both filter the baseband, wideband signal and apply sigma-delta modulation in order to convert the baseband, wideband signal of interest into an over-sampled delta-modulated digital signal format. Further, the mixer may act to generate separate in-phase (I) and quadrature-phase (Q) data streams as inputs to the digital filter 140.

The I and Q data streams, each of which are in the digital domain, may be operated upon using twos complement arithmetic, such as in the DC offset cancellation block 150. The DC cancellation circuitry 150 may incorporate multiple schemes for DC cancellation, operating in conjunction, to thereby provide an effective DC filter. The DC cancellation circuit 150 may utilize a programmable value that may be provided by an external controller. The programmable value preferably provides for a simple twos complement arithmetic DC offset adjustment. A second DC cancellation mechanism may be incorporated to allow for a fine and coarse adjustment of the DC offset by digitally controlling the analog RF front-end via the Serial Bus Interface (SBI) 160. In general, the SBI bus is used to digitally control the RF front-end 10. The presence of a digital to analog converter (DAC) may be included within the LNA 110 and ZIF 120 to allow the SBI 160 commands to be converted to analog controls within the LNA 110 and ZIF 120.

The DC offset cancellation function 150 additionally provides a stimulus to the automatic gain control (AGC) 170 circuitry. The AGC 170 circuitry controls the gain to the LNA 110 and ZIF 120 during specific modes of operation of the receiver front end by controlling the SBI 160 bus, by providing digital gain control information to the digital variable gain amplifier (DVGA) 180, and by providing digital phase correction information to the demodulator 190.

The DVGA 180, when operated following the DC offset cancellation circuitry 150, utilizes the digital domain for gain control. Digital domain gain control is an arithmetic operation implemented using registered logic, for example. This technique avoids the pitfalls of non-linear effects that occur when analog gain adjustments are made, such as at the output of the mixers in a standard heterodyne RF receiver. Non-linearities, such as inter-modulation (IM) products and signal compression, can add distortion to data. Digital manipulation of gain is less susceptible to these non-linearities.

As will be readily recognized by one possessing an ordinary skill in the pertinent arts, because a mobile communications device, such as one incorporating the receiver front end 10 of FIG. 1, may roam into an area served by a relatively narrow-band communications system, as the term "roam" is conventionally understood by those possessing an ordinary skill in the pertinent art, it is desirable to ensure that such a mobile communications device is compatible with systems that utilize narrow-band signals, such as ones used in connection with AMPS, for example. In such a case, utilization of the receiver front end 10 may result in the inadvertent attenuation of the narrow-band signal when DC cancellation is performed, for example. This may result in performance degradation of the mobile communications device when used in combination with such narrow band signals, for example.

Generally, according to an aspect of the present invention, support for narrow-band RF signals is provided by directly down-converting a spectrum including an RF narrow-band signal of interest to baseband, such that the narrow-band signal of interest results at a low intermediate frequency (IF). In other words, according to an aspect of the present invention, instead of downconverting the narrow-band signal of interest directly to baseband such that DC cancellation may result in signal attenuation, and with reference to the AMPS network for purposes of explanation only, a narrow-band AMPS signal is directly down-converted to a low IF using the ZIF filters and mixers. According to an aspect of the present invention, after baseband sampling and filtering, the resulting low-IF signal is converted to baseband using digital phase rotation. According to an aspect of the present invention, the digitally phase rotated to baseband signal is filtered to remove unwanted noise, such as from adjacent channels, or "jammers", for example. In other words, and referring again to the previous AMPS non-limiting example, the down converted AMPS signal of interest is then converted down to baseband using a phase rotator and is subsequently low pass filtered, for example. According to an aspect of the present invention, this rotation and filtering can be done after baseband channel filtering and DC cancellation such that the narrow-band RF signal of interest is not unduly attenuated.

Figure 2:
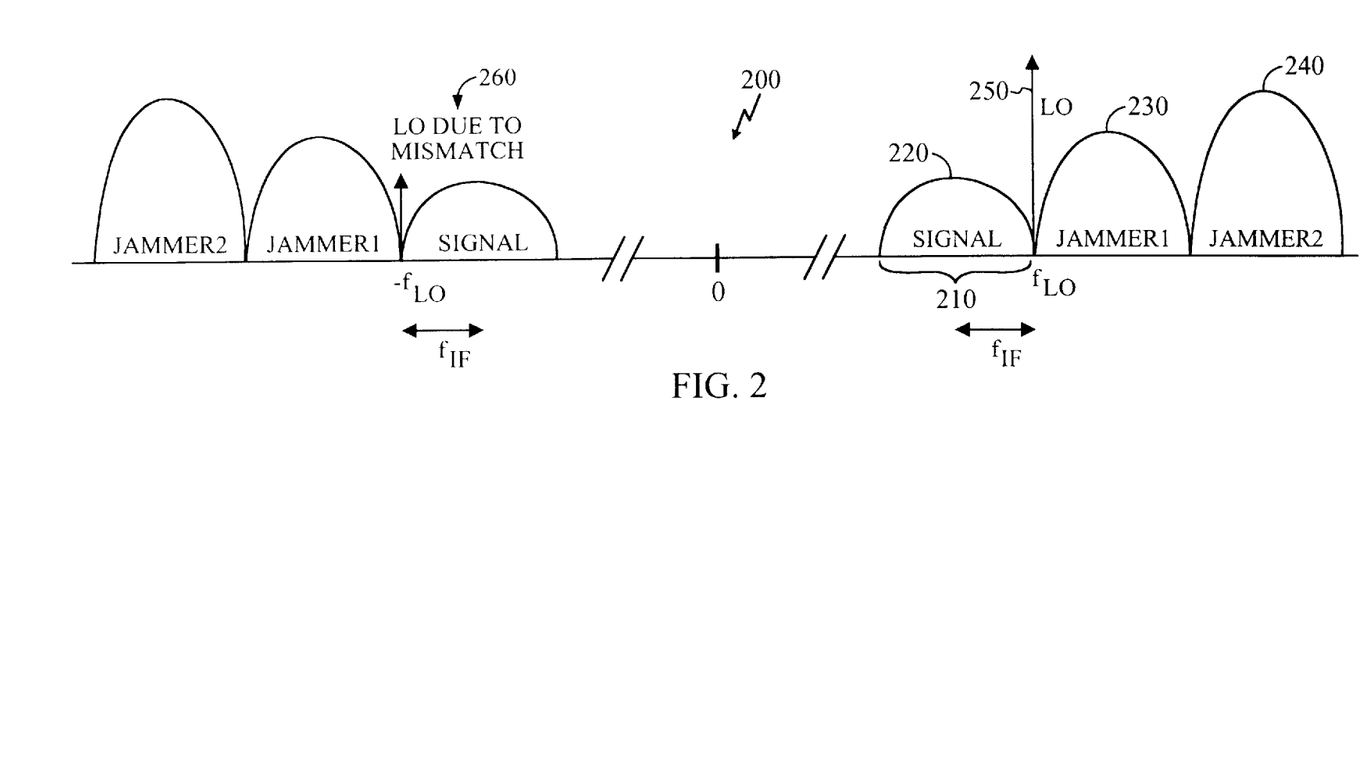
FIG. 2 illustrates a narrowband signal at RF in combination with adjacent channels.

Referring now to FIG. 2, an RF signal spectrum 200 is shown therein. For purposes of illustration only, the spectrum 200 shown in FIG. 2 has been limited to narrowband signal 220 of interest on a channel 210 and adjacent channels 230, 240 (also referred to herein as "jammer1" and "jammer2"). Local Oscillator (LO) signal 250 for use with the narrow-band signal 220 is also shown. Preferably, the LO signal 250 has a substantially line spectrum at the LO frequency $f_{LO}$. According to an aspect of the present invention, the frequency $f_{LO}$ is approximately equivalent to the center frequency of the narrow-band signal of interest 220 plus ½ of the bandwidth of the channel 210. As will be evident to one possessing an ordinary skill in the pertinent art, when the LO signal 250 and narrow-band signal of interest 220 are mixed, down-conversion of the narrow-band signal of interest 220 to a non-zero, low intermediate frequency results. According to an aspect of the present invention the frequency $f_{LO}$ may overlap the spectrum of any of the signal 220 or adjacent channels, e.g. 230, 240. It should be noted that due to I/Q phase and amplitude mismatch, a mirror of the LO signal 260 appears at the −LO frequency −$f_{LO}$, while mirrors of the signal 220 and channels 230 and 240 also appear, which will be readily understood by those possessing an ordinary skill in the pertinent art.

Figure 3:
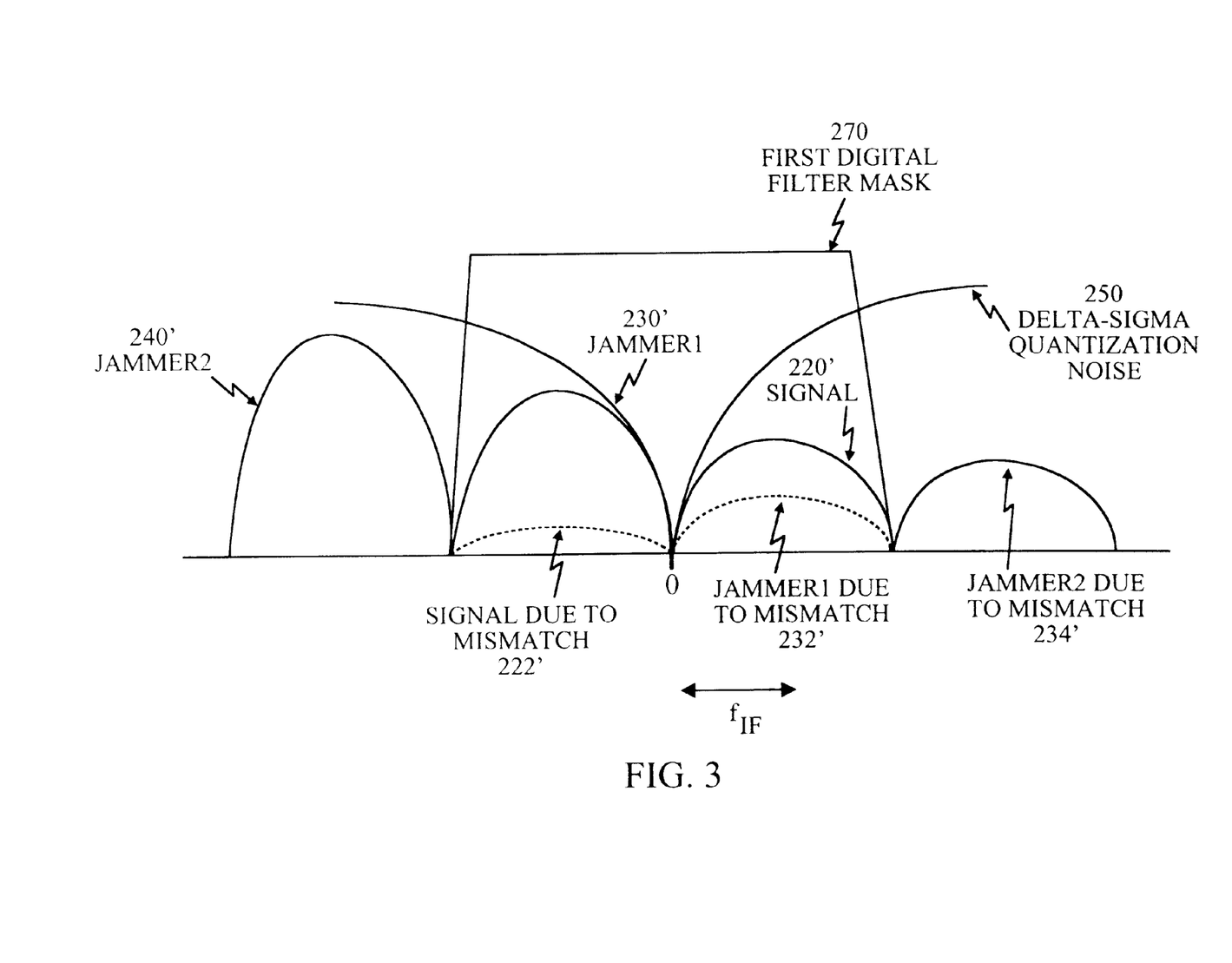
FIG. 3 illustrates the signal of FIG. 1, after downconversion to a low intermediate frequency and analog to digital conversion according to an aspect of the present invention.

Referring now also to FIG. 3, there is shown the spectrum of a signal 220' resulting from down-conversion of the signal 220 to a low-IF frequency $f_{IF}$, as was discussed with regard to FIG. 2. Also shown in FIG. 3 is the spectrum 230' resulting from down-conversion of the signal 230, and spectrum 240' resulting from down-conversion of the signal 240, as well as resulting delta-sigma converter quantization noise 250 resulting from delta-sigma modulation as was discussed with regard to FIG. 1. Further shown in FIG. 3 are the spectrum of signals 222', 232' and 242' produced due to mismatch in gain and phase between the I and Q channels in down-converting and anti-aliasing filtering of the signal 220, and channels 230 and 240, respectively. It should be recognized, however, that static gain mismatch can be at least partially compensated for using the first digital filter 140, for example. As will be evident to one possessing an ordinary skill in the art, due to the selection of $f_{LO}$ so as to be offset from the center of the channel 210, the spectrum 220' is similarly offset from baseband frequency 0.

For purposes of explanation, the spectrum 270 of the mask of the first digital filter 140 is also shown in FIG. 3. According to an aspect of the present invention, the first digital filter 140 serves to at least partially remove quantization noise and adjacent channels Up to and including the next-to-adjacent channel 240 (jammer2). According to an aspect of the present invention, the first digital filter 140 passes a wide enough spectrum such that it does not remove the spectrum 230' resulting from down-conversion of adjacent channel 230 (jammer1). According to an aspect of the present invention, anti-aliasing filtering can be provided prior to delta-sigma conversion, which also attenuates the next-to adjacent channel 240 (jammer2).

Figure 4:
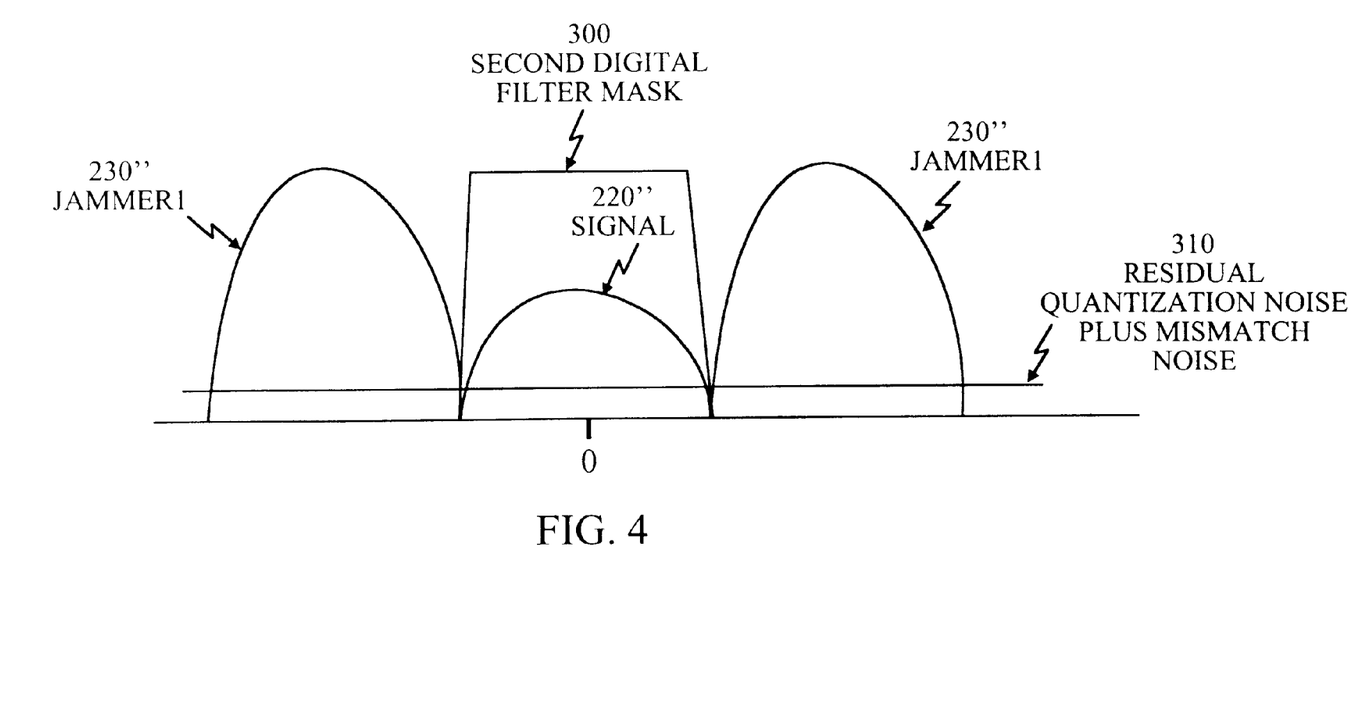
FIG. 4 illustrates the signal of FIG. 2 after conversion to baseband frequency according to an aspect of the present invention.

According to an aspect of the present invention, the signal 220', along with adjacent channel 230' (jammer1), is then digitally rotated down to baseband. The resulting spectrum is shown in FIG. 4. Still referring to FIG. 4, there is shown spectrum 220" resulting from phase rotation of the signal 220', as well as spectrum 230" resulting from phase rotation of the signal 230'. According to an aspect of the present invention, the signal 230", corresponding to the adjacent channel 30 (jammer1), is attenuated using a second digital filter mask. According to an aspect of the present invention, the second digital filter mask passes a bandwidth 300 corresponding to the down-converted and phase rotated signal 20, i.e. signal 220". Residual noise 310, due to quantization and mismatch for example, is shown in FIG. 4 as a substantially flat spectrum. It should be understood that the spectrum of this residual noise can take other forms as well.

Figure 5:
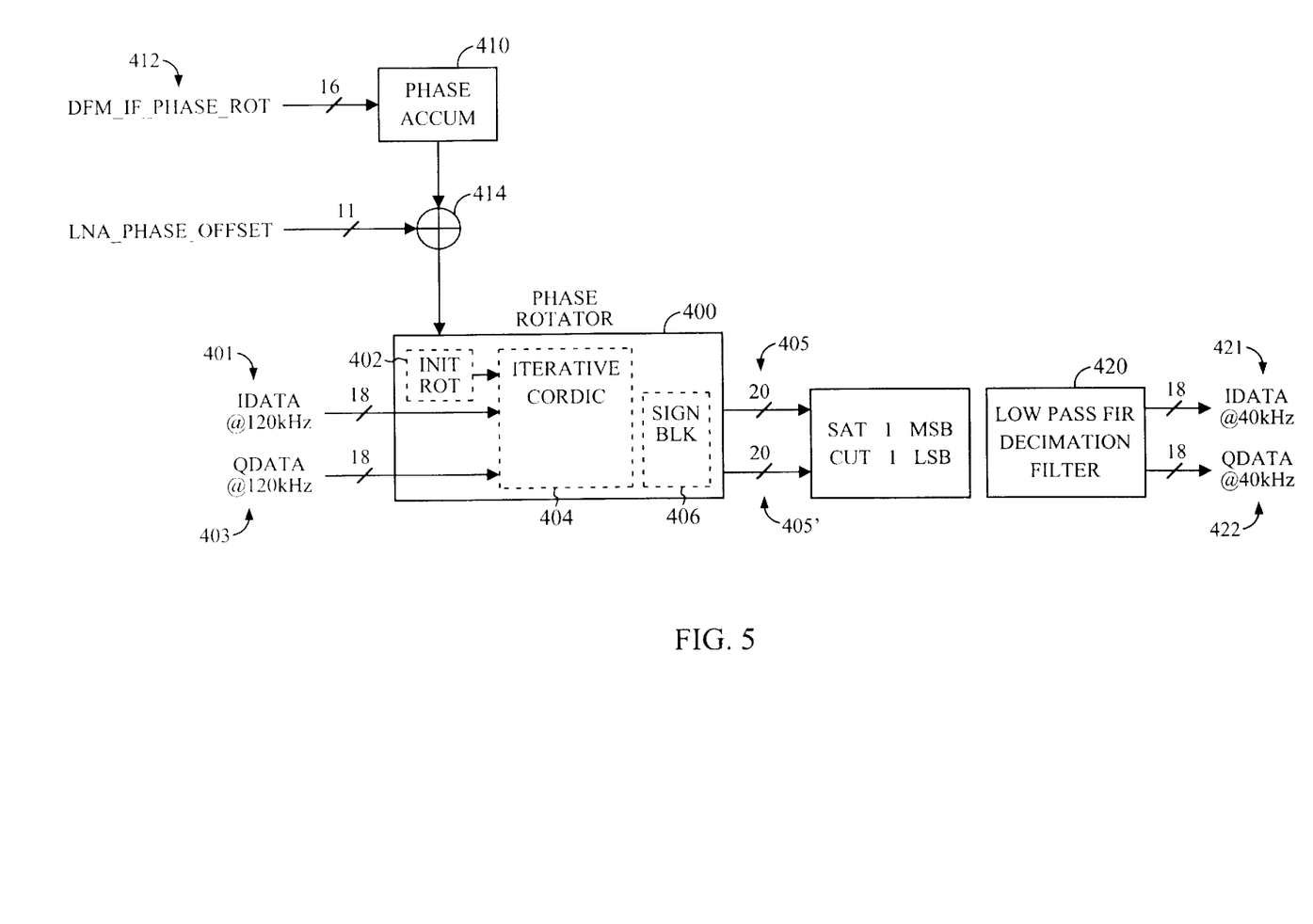
FIG. 5 illustrates a block diagram of a DFM low IF phase rotator and low pass filter suitable for use with the present invention; and, FIG. 6 illustrates a schematic view of the DFM phase rotator and low pass filter of FIG. 5.

Referring now to FIG. 5, there is shown a block diagram illustrating an interrelation between a low IF phase rotator 400, a phase accumulator 410, and low pass decimation filter 220 suitable for rotating the down-converted signal spectrum 220' to baseband to provide the signal spectrum 220". According to an aspect of the present invention, the phase rotator 400, phase accumulator 410, and low pass decimation filter 420 can be interposed between the DC offset cancellation block 150 of FIG. 1 and DVGA 180 of FIG. 1.

It should be understood that during operation, when the gain of the LNA 110 is changed, a phase discontinuity may be introduced. Phase compensation, using phase rotators such as those discussed herein, can be effected to reduce this discontinuity. It should be understood phase rotators in general, as well as their implementation and use, is well understood by those possessing an ordinary skill in the pertinent arts.

Nonetheless, for purposes of explanation, the phase accumulator 410 receives input on communications line 412 being indicative of a stepping value for the accumulator 410 which corresponds to the phase rotation to be effected. That is, in the case of a narrow-band signal having a 30 kHz bandwidth, a stepping value equivalent to approximately ½ thereof, or 15 kHz. The phase accumulator 410 tracks the time varying phase offset of the received signal and serves to calculate a dynamic phase offset for each digital sample of the incoming signal, so that a phase shift for each sample can be effected, thus frequency shifting the incoming signal. The phase accumulator 410 provides an output 414 equivalent to the accumulation of the step values received on input 412. According to an aspect of the invention, the input 412 takes the form of 16 bits while the output 414 takes the form of 14 bits of digital data.

The phase rotator 400 includes an initial rotation block 402, based upon output 414 of the phase accumulator 410, a COordinate Rotation DIgital Computer (CORDIC) 404 and a sign block 406. Of course, the implementation and use of CORDICs is also well understood in the pertinent art. Because of the well documented limitation of a CORDIC to perform shifts equivalent to ±90°, the initial rotation block 402 converts rotations outside of this range into this range. The sign block 406 essentially undoes this initial rotation, when effected, after CORDIC 404 operation. According to an aspect of the present invention, the CORDIC 404 receives a value, which may be initially rotated, and which is based upon the output 414 of the phase accumulator 410. The CORDIC 404 further receives 18 bits of I channel data 401 and 18 bits of Q channel data 403, at a rate of 120 kHz according to an aspect of the present invention, from the DC offset cancellation block 150 (FIG. 1), for example. Using the accumulated phase from the phase accumulator 410, the iterative CORDIC 404 performs dynamic phase shift, or frequency conversion from a low IF to baseband, such as by using a Lookup Table (LUT), for example, and provides 18 bits of I and 18 bits of Q channel data as signals 405, 406 to low pass filter 420. According to an aspect of the present invention, the low pass filter 420 can take the form of a Infinite Impulse Response (IIR) decimation filter, which performs filtering and decimation and provides 18 bits of I channel data 421 and 18 bits of Q channel data 422 at a rate of approximately 40 kHz, for example. This data can be provided to the DVGA 180 (FIG. 1), for example. According to an aspect of the present invention, the filter 420 performs the function of the aforementioned second digital filter. According to an aspect of the present invention, the IIR filter 420 can take the form of a programmable filter.

Figure 6:
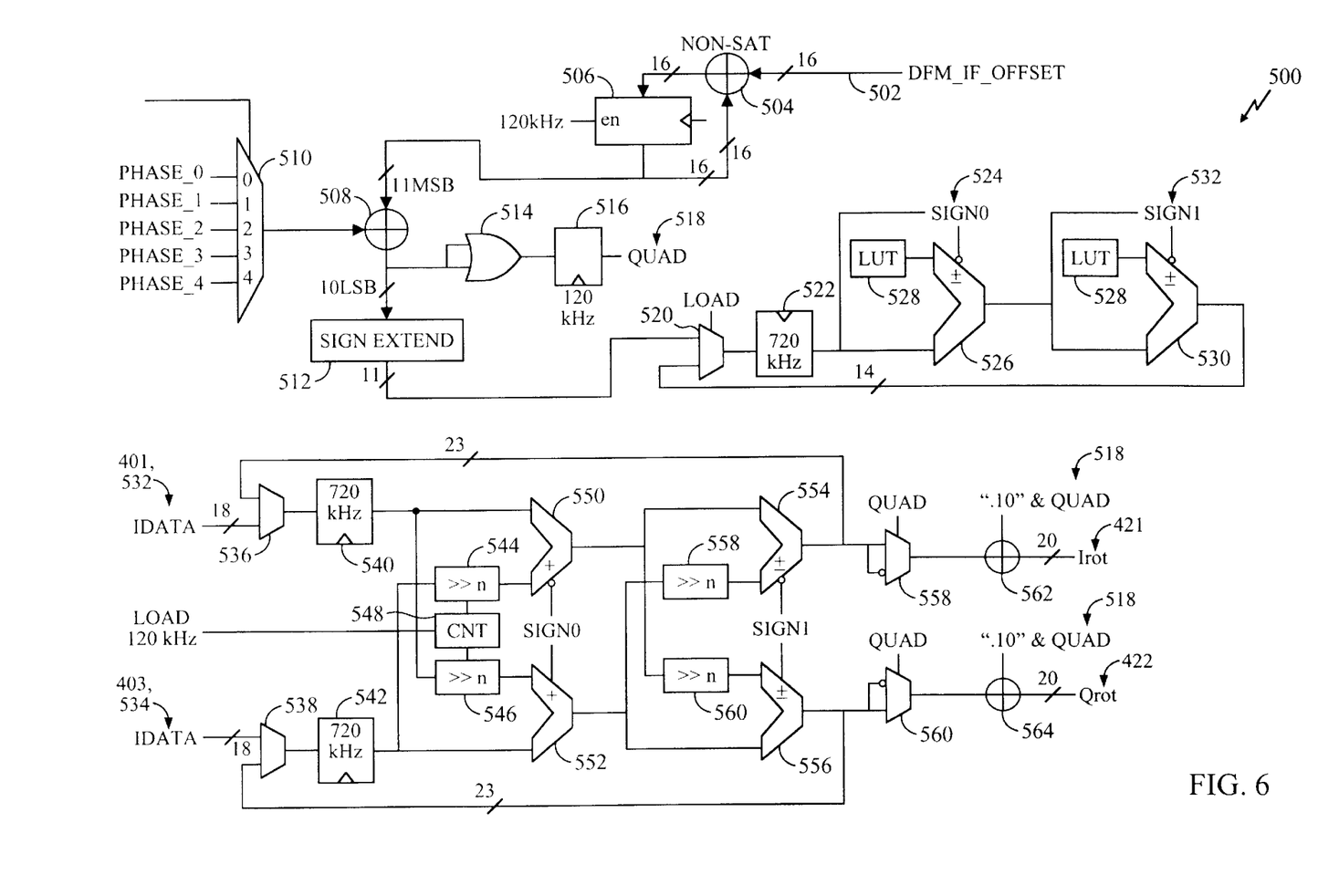

Referring now also to FIG. 6, there is shown a schematic representation of a circuit 500 suitable for implementing the phase rotator 400 and phase accumulator 410 of FIG. 5, according to an aspect of the present invention. Again, it should be understood that the circuit 500 is merely an example of a suitable phase rotator and accumulator for use in accordance with the present invention, and that phase rotators, accumulators and CORDICs are well understood by those possessing an ordinary skill in the pertinent art.

The circuit 500 includes an input 502 for receiving the aforementioned stepping value. The input 502 may be coupled as one of two inputs to a summing junction 504. The output of the summing junction is provided as an input to a flip-flop 506. The output of the flip-flop 506 is provided as the second input for the summing junction 504.

In the non-limiting and illustrated case of FIGS. 5 and 6, 16 bits of data are provided on the input 502. In this same non-limiting example, the eleven most significant bits output from the flip-flop 506 are provided to a summing junction 508. The summing junction 508 further receives an input from multiplexer 510 being indicative of a multiplexed output of a plurality of phase offset values. The summing junction 508 provides an output to a sign extension block 512. The two most significant bits of the output from the summing junction 508 are also provided as inputs to an OR logic gate 514 which provides an input for a flip-flop 516. The flip-flop 516 provides a signal 518 ("quad") as its output.

Referring again to the sign extension block 512, it provides an output to a multiplexer 520. The multiplexer 520 provides an input to a flip-flop 522. The flip-flop 522 provides a signal 524 ("sign0") as its output. The signal 524 is provided as a control signal to an adder/subtrator 526, which also receives the signal 524 on its input along with a signal from a look-up table 528. The look-up table 528 includes values associated with various phase-shifts, as is conventionally understood. An output of the adder/subtractor 526 is provided as an input for another adder/subtractor 530 and as a signal 532 ("sign1") which is provided on a control input for the adder/subtractor 530. A signal from the look-up table 528 is again provided to the adder/subtractor 530. The output of the adder/subtractor 530 is provided as another input for the multiplexer 520. In the illustrated case, as fourteen bits of data.

Still referring to FIG. 6, inputs 532 and 534 provide I and Q data, from the DC offset cancellation block 150 of FIG. 1, for example. The inputs 532, 534 are respectively coupled to multiplexers 536, 538. The outputs of the multiplexers 536, 538 are respectively provided to flip-flops 540, 542. The outputs of the flip-flops 542, 540 are respectively provided to shift right registers 544, 546. The shift registers 544, 546 logically shift the value input to the right by "n" places, wherein "n" is a predetermined value. The registers 544, 546 are responsive to a control input 548 corresponding to a clock rate at which the inputs 532, 534 receive data. The output of the flip-flops 540, 542 are also provided as inputs to adder/subtractors 550, 552, respectively. The outputs of shift registers 544, 546 are also provided as inputs to the adder/subtrators 550, 552. The adder/subtractors 550, 552 are responsive to the signal 524 ("sign0").

The outputs of the adder/subtractors 550, 552 are provided to adder/subtractors 554, 556, respectively. The outputs of the adder/subtractors 552, 550 are also respectively provided to shift right registers. According to an aspect of the present invention, the shift register 558 may shift the value input by n+2 places, for example, while the shift register 560 may shift the value input n+1 places, for example. The outputs of the shift registers 558, 560 are respectively provided as inputs to the adder/subtractors 554, 556. The adder/subtractors 554, 556 are responsive to the signal 532 ("sign1"). The outputs of the adder/subtractors 554, 556 are provided as inputs to multiplexers 558, 560, respectively. The outputs of multiplexers 558, 560 are respectively provided to summing junctions 562, 564. Summing junctions 562, 564 further receive a pre-set constant and the signal 518 ("quad"). The outputs of summing junctions 562, 564 can be provided as inputs for a digital filter or DVGA, for example.

According to an aspect of the present invention, the flip-flops 522, 540 and 542 run at a higher rate than data is received on inputs 532, 534. For example, if data is received using the inputs 532, 534 at a rate of 120 kHz, these flip-flops can be operated at a rate of 720 kHz. This enables multiple iterations per result, as will be readily understood by those possessing an ordinary skill in the pertinent art.

Although the invention has been described and pictured in a preferred form with a certain degree of particularity, it is understood that the present disclosure of the preferred form has been made by way of example, and that numerous changes in the details of construction and combination and arrangement of parts and steps may be made without departing from the spirit and scope of the invention as is hereinafter claimed.

What is claimed is:

1. A converter for converting received narrow-band and wideband RF signals to baseband, comprising:
   a direct down converter for directly down-converting a signal spectrum correspondent to the wide-band RF signals to base band, and for directly down-converting a signal spectrum including the at least one narrow-band RF signal to baseband, resulting in the narrow band RF signal results at a low IF; and,
   a phase rotator, coupled to said direct down converter, for digitally phase rotating said down-converted signal spectrum including said at least one narrow-band RF signal from said low-IF to baseband.

2. The converter of claim 1, wherein said phase rotator comprises a low-pass, decimation filter.

3. The converter of claim 2, wherein said low-pass, decimation filter is a finite impulse response filter.

4. The converter of claim 1, wherein said direct down converter comprises a Zero Intermediate Frequency down converter.

5. The converter of claim 1, further comprising a phase accumulator coupled to said phase rotator, wherein said phase rotator is responsive to said phase accumulator.

6. The converter of claim 5, wherein said phase accumulator is responsive to a signal corresponding to a difference between said low IF and baseband.

7. The converter of claim 6, further comprising a decimation filter coupled to said phase accumulator.

8. The converter of claim 7, further comprising a variable gain amplifier coupled to said decimation filter.

9. The converter of claim 8, wherein said decimation filter includes a pass band corresponding approximately with a bandwidth of said narrow-band signal of interest.

10. The converter of claim 1, further comprising a first digital filter interposed between said direct down converter and phase rotator and having a pass band corresponding approximately with a bandwidth of said narrow-band signal of interest and at least one adjacent channel to said narrow-band signal of interest.

11. The converter of claim 10, further comprising a second digital filter coupled to said phase rotator and having a pass band corresponding approximately with a bandwidth of said narrow-band signal of interest.

12. A method for converting at least one narrow band RF signal for transmission to at least one communications device for receiving wide-band RF signals, to baseband, comprising:
   directly down-converting a signal spectrum, wherein the signal spectrum includes the at least one RF narrow-band signal, to baseband, resulting in the at least one narrow-band RF signal at a low IF; and,
   digitally phase rotating the down-converted signal spectrum, resulting in a phase rotation of the at least one narrow-band RF signal from the low-IF to baseband.

13. The method of claim 12, further comprising filtering the down-converted signal spectrum prior to said digital phase rotating.

14. The method of claim 12, further comprising filtering the phase rotated signal spectrum.

15. The method of claim 12, further comprising filtering the down-converted signal spectrum prior to said digitally phase rotating.

16. The method of claim 12, wherein said directly down-converting comprises filtering and mixing.

17. The method of claim 16, wherein said filtering comprises filtering to remove at least one of:
   at least one adjacent channel; and
   quantization noise.

18. The method of claim 12, wherein said directly down converting comprises mixing the signal spectrum including said at least one RF narrowband signal with a signal having a predetermined frequency.

19. The method of claim 18, wherein the narrow-band signal of interest is transmitted by a given channel, and wherein the predetermined frequency is adjacent to the given channel.

20. The method of claim 19, wherein the predetermined frequency is approximately equal to the frequency of the narrow-band signal of interest plus one-half of the given bandwidth.

21. The method of claim 19, wherein the predetermined frequency is between the given channel and at least one adjacent channel.

22. The method of claim 18, wherein the signal at the predetermined frequency corresponds to a local oscillator signal that exhibits a substantially line spectrum.

23. The method of claim 12, wherein said down-converting comprises directly down converting using a Zero Intermediate Frequency compatible scheme.

24. A method for receiving both wide-band and narrow-band RF signals using a single communications device, said method comprising:

directly down-converting said wide-band RF signals to baseband;

down-converting a signal spectrum including said at least one RF narrowband signal to baseband, such that the narrow band RF signal results at a low IF; and, digitally phase rotating said down-converted signal spectrum such that said at least one RF narrow-band signal is down-converted from said low-IF to baseband.

* * * * *